(12) United States Patent
Standing et al.

(10) Patent No.: US 9,620,471 B2
(45) Date of Patent: Apr. 11, 2017

(54) POWER SEMICONDUCTOR PACKAGE WITH CONDUCTIVE CLIPS

(71) Applicant: Infineon Technologies Americas Corp., El Segundo, CA (US)

(72) Inventors: Martin Standing, Velden (AT); Robert J. Clarke, East Peckham (GB)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 14/723,378

(22) Filed: May 27, 2015

(65) Prior Publication Data

US 2015/0262960 A1 Sep. 17, 2015

Related U.S. Application Data

(60) Continuation of application No. 12/283,204, filed on Sep. 10, 2008, now Pat. No. 9,048,196, which is a
(Continued)

(51) Int. Cl.
*H01L 23/495* (2006.01)
*H01L 23/498* (2006.01)
(Continued)

(52) U.S. Cl.
CPC .......... *H01L 24/33* (2013.01); *H01L 23/296* (2013.01); *H01L 23/3107* (2013.01); *H01L 23/4824* (2013.01); *H01L 23/4951* (2013.01); *H01L 23/49562* (2013.01); *H01L 24/97* (2013.01); *H01L 29/201* (2013.01); *H01L 29/2003* (2013.01); *H01L 29/41725* (2013.01); *H01L 29/4232* (2013.01); *H01L 24/81* (2013.01); *H01L 24/83* (2013.01); *H01L 2224/05568* (2013.01); *H01L 2224/05573* (2013.01); *H01L 2224/16* (2013.01); *H01L 2224/293* (2013.01); *H01L 2224/2929* (2013.01); *H01L 2224/2969* (2013.01); *H01L 2224/29611* (2013.01);
(Continued)

(58) Field of Classification Search
None
See application file for complete search history.

(56) References Cited

U.S. PATENT DOCUMENTS 3,878,553 A * 4/1975 Sirles ............... H01L 23/4824
257/522
4,359,754 A 11/1982 Hayakawa et al.
(Continued)

FOREIGN PATENT DOCUMENTS

JP 6242539 A 2/1987
JP 62188275 A 8/1987
(Continued)

OTHER PUBLICATIONS

International Search Report dated Apr. 19, 2006 from the corresponding PCT Application No. PCT/US05/32743.
(Continued)

*Primary Examiner* — Hoang-Quan Ho
(74) *Attorney, Agent, or Firm* — Shumaker & Sieffert, P.A.

(57) ABSTRACT

A power semiconductor package that includes a semiconductor die having at least two power electrodes and a conductive clip electrically and mechanically coupled to each power electrode.

14 Claims, 3 Drawing Sheets

Related U.S. Application Data division of application No. 11/225,720, filed on Sep. 13, 2005, now Pat. No. 7,466,012.

(60) Provisional application No. 60/609,597, filed on Sep. 13, 2004.

(51) Int. Cl.
*H01L 23/00* (2006.01)
*H01L 23/31* (2006.01)
*H01L 23/482* (2006.01)
*H01L 23/29* (2006.01)
*H01L 29/20* (2006.01)
*H01L 29/201* (2006.01)
*H01L 29/417* (2006.01)
*H01L 29/423* (2006.01)

(52) U.S. Cl.
CPC .............. *H01L 2224/29644* (2013.01); *H01L 2224/8121* (2013.01); *H01L 2224/81054* (2013.01); *H01L 2224/81224* (2013.01); *H01L 2224/81815* (2013.01); *H01L 2224/8384* (2013.01); *H01L 2224/83815* (2013.01); *H01L 2224/83851* (2013.01); *H01L 2924/00011* (2013.01); *H01L 2924/014* (2013.01); *H01L 2924/01013* (2013.01); *H01L 2924/01029* (2013.01); *H01L 2924/0132* (2013.01); *H01L 2924/01033* (2013.01); *H01L 2924/01049* (2013.01); *H01L 2924/01078* (2013.01); *H01L 2924/01079* (2013.01); *H01L 2924/01082* (2013.01); *H01L 2924/0715* (2013.01); *H01L 2924/1032* (2013.01); *H01L 2924/12032* (2013.01); *H01L 2924/12042* (2013.01); *H01L 2924/12044* (2013.01); *H01L 2924/1306* (2013.01); *H01L 2924/13062* (2013.01); *H01L 2924/13064* (2013.01); *H01L 2924/13091* (2013.01); *H01L 2924/181* (2013.01); *H01L 2924/186* (2013.01); *H01L 2924/30101* (2013.01)

(56) References Cited

U.S. PATENT DOCUMENTS

| | | |
|---|---|---|
| 4,390,598 A | 6/1983 | Phy |
| 4,635,092 A | 1/1987 | Yerman et al. |
| 4,721,986 A | 1/1988 | Kinzer |
| 4,755,697 A | 7/1988 | Kinzer |
| 5,393,705 A | 2/1995 | Sonobe |
| 5,483,092 A | 1/1996 | Kosaki |
| 5,763,929 A | 6/1998 | Iwata |
| 5,847,436 A | 12/1998 | Iwata |
| 5,959,363 A | 9/1999 | Yamada et al. |
| 6,093,970 A | 7/2000 | Ohsawa et al. |
| 6,166,436 A | 12/2000 | Maeda et al. |
| 6,307,261 B1 | 10/2001 | Val et al. |
| 6,774,466 B1 | 8/2004 | Kajiwara et al. |
| 6,825,548 B2 | 11/2004 | Fujioka et al. |
| 6,936,855 B1 | 8/2005 | Harrah |
| 7,466,012 B2 | 12/2008 | Standing et al. |
| 7,507,999 B2 | 3/2009 | Kusumoto et al. |
| 9,048,196 B2 * | 6/2015 | Standing .............. H01L 23/3107 |
| 2001/0020700 A1 | 9/2001 | Inoue et al. |
| 2001/0033022 A1 | 10/2001 | Ewer |
| 2001/0042906 A1 | 11/2001 | Nakamura et al. |
| 2002/0011651 A1 | 1/2002 | Ichinose |
| 2002/0180005 A1 | 12/2002 | Haematsu |
| 2003/0107053 A1 | 6/2003 | Uemura et al. |
| 2003/0218246 A1 | 11/2003 | Abe et al. |
| 2004/0000676 A1 | 1/2004 | Fujioka et al. |
| 2004/0021156 A1 | 2/2004 | Asano et al. |
| 2004/0021233 A1 | 2/2004 | Kinzer et al. |
| 2004/0104791 A1 | 6/2004 | Satoh et al. |
| 2004/0178509 A1 | 9/2004 | Yoshino et al. |
| 2004/0212017 A1 | 10/2004 | Mizuno et al. |
| 2005/0199899 A1 | 9/2005 | Lin et al. |
| 2006/0027937 A1 | 2/2006 | Benson et al. |
| 2006/0081985 A1 | 4/2006 | Beach et al. |
| 2007/0176291 A1 | 8/2007 | Cheah et al. |

FOREIGN PATENT DOCUMENTS

| | | |
|---|---|---|
| JP | 1048859 A | 2/1989 |
| JP | 2138773 A | 5/1990 |
| JP | 10074793 A | 3/1998 |
| JP | 10223901 A | 8/1998 |
| JP | 2000150536 A | 5/2000 |
| JP | 2002359257 A | 12/2002 |
| JP | 200331569 A | 1/2003 |
| JP | 2003258001 A | 9/2003 |
| JP | 2003258179 A | 9/2003 |
| WO | 2004008512 A1 | 1/2004 |

OTHER PUBLICATIONS

Prosecution History from U.S. Appl. No. 11/225,720, dated May 31, 2007 through Jul. 9, 2008, 43 pp.

Prosecution History from U.S. Appl. No. 12/283,204 dated Feb. 15, 2011 through Jan. 30, 2015, 174 pp.

* cited by examiner

POWER SEMICONDUCTOR PACKAGE WITH CONDUCTIVE CLIPS

CROSS-REFERENCE TO RELATED APPLICATION

This is a continuation of application Ser. No. 12/283,204 filed Sep. 10, 2008, which itself is a divisional of application Ser. No. 11/225,720, filed Sep. 13, 2005, now U.S. Pat. No. 7,466,012, which in turn claims priority to U.S. provisional application Ser. No. 60/609,597, filed on Sep. 13, 2004. The disclosures in the above-referenced patent applications are hereby incorporated fully by reference into the present application.

FIELD OF INVENTION

The present invention relates to power semiconductor packages, and a process of fabricating a power semiconductor package.

BACKGROUND AND SUMMARY OF THE INVENTION

The newest generation of power semiconductor die are small in size, while of higher power capability. Thus, power semiconductor packages must be capable of making small, but low resistance connections to the new generation of power semiconductor devices, and still offer usable pin-out and external connection capability for the end user.

A power semiconductor package according to the present invention includes a power semiconductor die having at least a first power electrode and a second power electrode, a first conductive clip electrically and mechanically coupled to the first power electrode, and a second conductive clip electrically and mechanically coupled to the second power electrode.

According to one aspect of the present invention, a passivation body encapsulates the semiconductor die and preferably at least portions of the first and second conductive clip. The passivation body is a thin film of dielectric polymer that is capable of protecting the semiconductor die without the need for a housing made from, for example, mold compound or any other type of housing material. A suitable material for forming the passivation body is a polysiloxane based polymer.

According to another aspect of the present invention, each power electrode of the semiconductor die includes a plurality of spaced power fingers electrically and mechanically connected to corresponding fingers of a respective clip.

A semiconductor package according to the present invention is most suitable for III-nitride based power semiconductor devices, such as power semiconductor devices based on alloys of InAlGaN (e.g. GaN, AlGaN) in that such devices have very small physical dimensions but high power capability requiring low resistance connection. However, the present concept can be equally applied to small silicon based devices that cannot be rendered connectable to external elements using conventional technology.

Other features and advantages of the present invention will become apparent from the following description of the invention which refers to the accompanying drawings.

DETAILED DESCRIPTION OF EMBODIMENTS OF THE INVENTION

Figure 1:
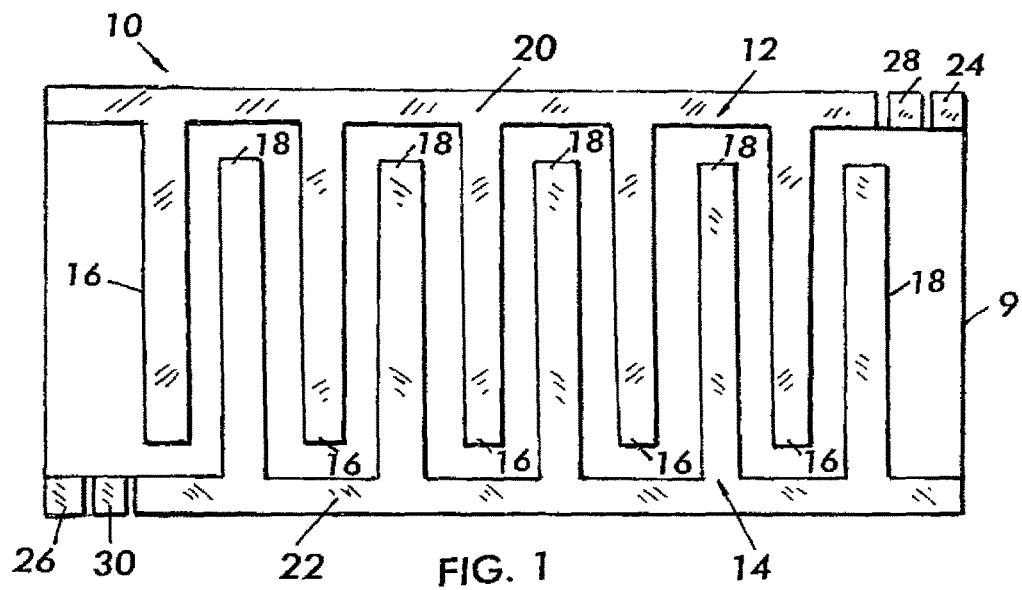
FIG. 1 schematically shows a top plan view of a semiconductor die used in a preferred embodiment of the present invention.

Referring to FIG. 1, a power semiconductor die 10 for use in a package according to the present invention includes at least semiconductor body 9, first power electrode (source electrode or drain electrode) 12, and second power electrode (source or drain electrode) 14. Preferably, both power electrodes 12, 14 are disposed on the same surface of semiconductor body 9, and each includes a respective plurality of spaced power fingers 16, 18 arranged in an interdigitated pattern and electrically connected to one another by a common power feed 20, 22.

In the preferred embodiment, power semiconductor die 10 is a bidirectional power device which includes at least first control electrode (first gate electrode) 24, second control electrode (second gate electrode) 26, first current sense electrode 28, and second current sense electrode 30. U.S. patent application Ser. No. 11/056,062 shows an example of a bidirectional power semiconductor device. Semiconductor die 10 in a package according to the present invention is preferably a III-nitride based power device formed from alloys of InAlGaN (e.g. GaN, AlGaN). For example, semiconductor die 10 may be a III-nitride based Schottky device, or a high electron mobility transistor (HEMT) such as a metal insulator semiconductor heterojunction field effect transistor (MISHFET) or a metal oxide semiconductor heterojunction field effect transistor (MOSHFET) or any other III-nitride based heterojunction field effect transistor (HFET).

An example of a semiconductor die 10 for a package according to the present invention is approximately 1.8 mm×3.6 mm in size, and is preferably a bidirectional switching device that includes current sense capability. To realize good performance from such a semiconductor die the electrodes of the semiconductor die need to be connected to something more substantial. Otherwise, a substantial amount of spreading resistance will be accumulated. In addition, due to the small size of the die, the pitch of the electrodes prohibits direct connection by a user with conventional surface-mounting technologies. Thus, it is imperative for the packaging to redistribute the electrodes to a size and layout that can be handled in an end user's conventional production environment. For example, in a power semiconductor device, a power electrode having an 0.8 mm pitch or less will be difficult to connect directly to a conductive pad of a circuit board even if significant performance losses are accepted. Furthermore, in a die that is only 3.6 mm (or less) long, no more than four power electrodes can be reasonably expected even if the pitch is reduced to about 0.8 mm. A packaging concept according to the present invention is suitable for a power semiconductor device having power electrodes with a pitch that is about 0.8 mm or smaller.

A package according to the present invention provides connection to the die and achieves the redistribution by using fine geometry clip bonding. The clip in the preferred embodiment is made from a relatively thin (in the order of 0.100 mm or smaller) copper body that is plated to protect the copper and provide a good solder compatible finish.

Figure 2:
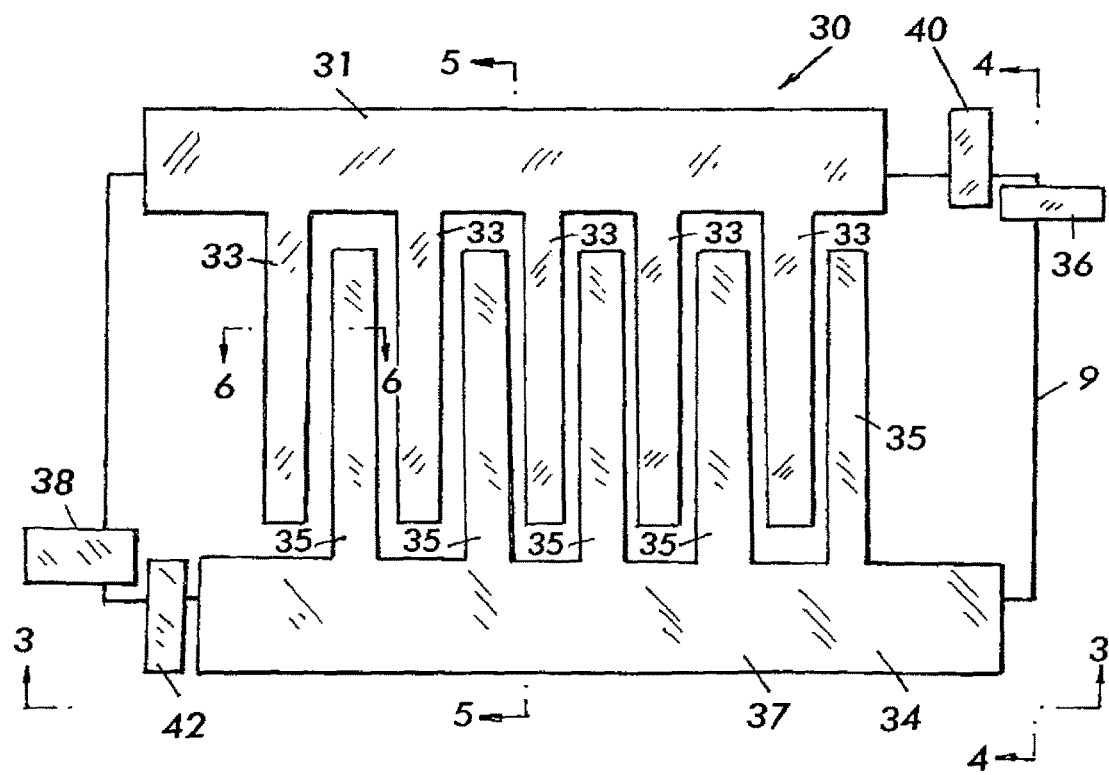
FIG. 2 schematically shows a bottom plan view of a power semiconductor package according to the preferred embodiment of the present invention.
Figure 3:
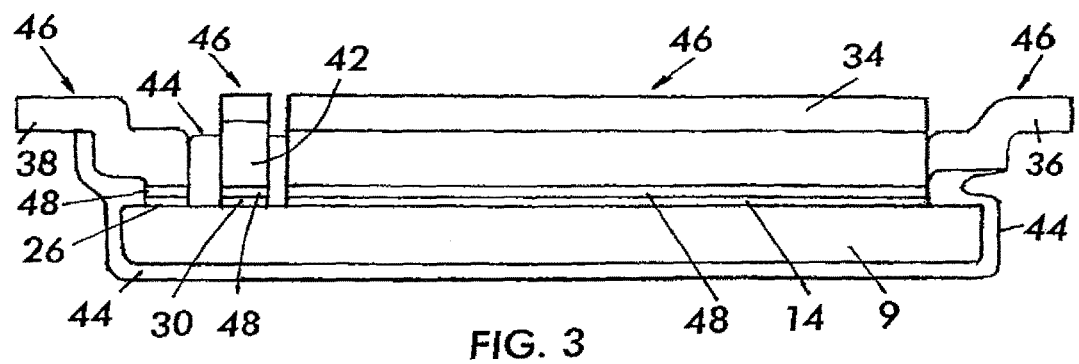
FIG. 3 schematically shows a side plan view of the package of FIG. 2 as would be see in the direction of the arrows 3-3.
Figure 4:
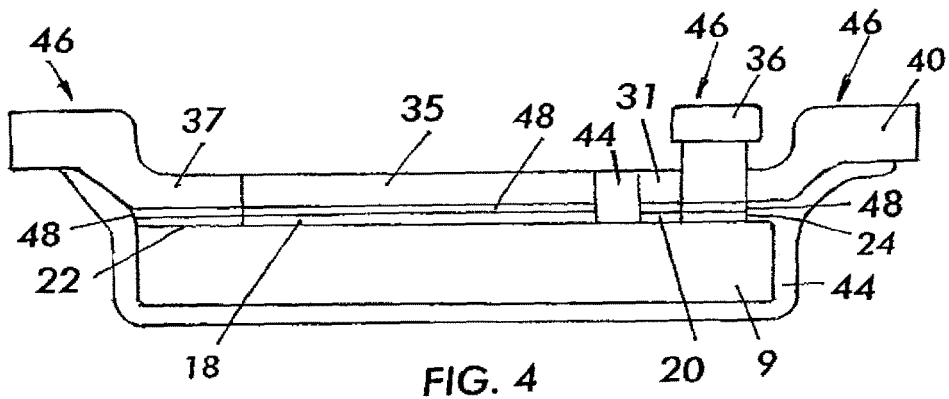
FIG. 4 schematically shows a side plan view of the package of FIG. 2 as would be see in the direction of the arrows 4-4.
Figure 5:
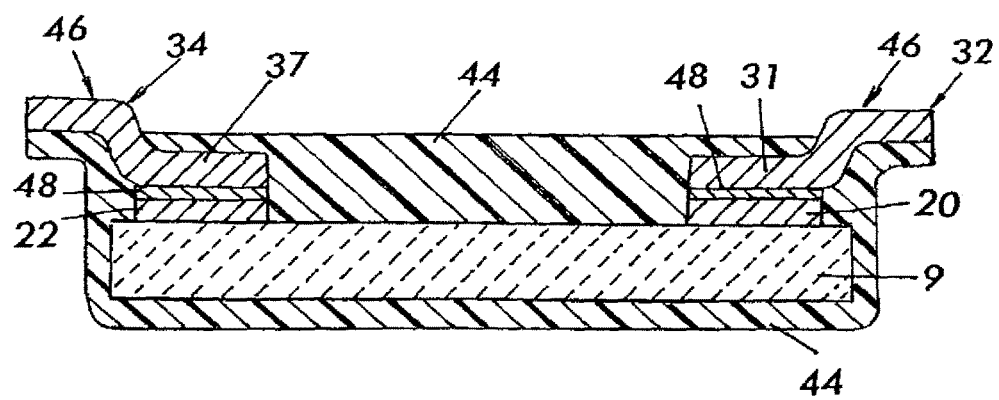
FIG. 5 schematically shows a cross-sectional view of the package of FIG. 2 along line 5-5 viewed in the direction of the arrows.
Figure 6:
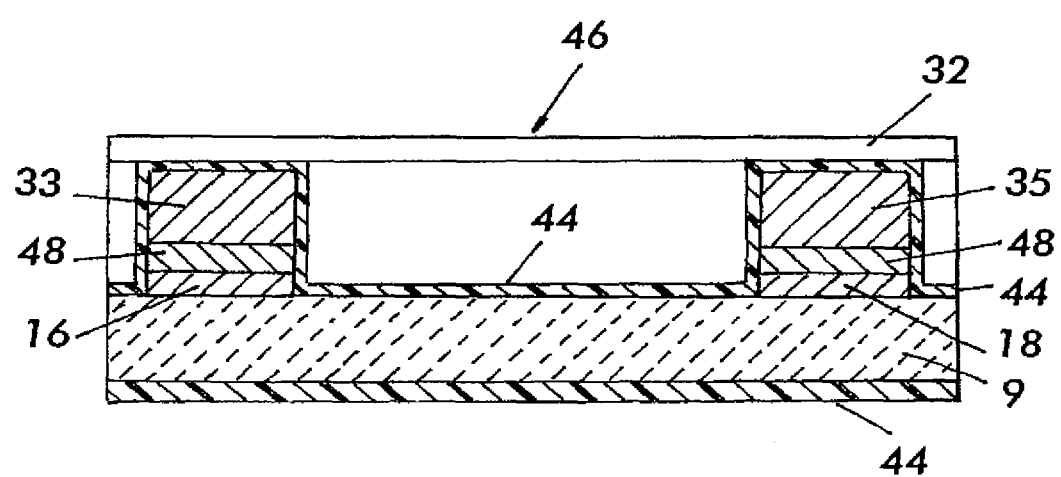
FIG. 6 schematically shows a cross-sectional view of the package of FIG. 2 along line 6-6 viewed in the direction of the arrows.

Referring next to FIG. 2, a power semiconductor package 30 according to the preferred embodiment of the present invention includes a semiconductor die 10, and at least first conductive clip 32 electrically and mechanically coupled to first power electrode 12, and second conductive clip 34 electrically and mechanically coupled to second power electrode 14. Each conductive clip 32, 34 includes preferably a plurality of spaced fingers. Thus, first conductive clip 32 includes fingers 33, which are electrically and mechanically coupled to power fingers 16, and second conductive clip 34 includes fingers 35 which are electrically and mechanically coupled to fingers 18. Fingers 33 are integral with a first common connector 31, and fingers 35 are integral with a second common connector 37. Common connectors 31, 37 serve as external power leads. A device according to the preferred embodiment may further include a conductive clip electrically and mechanically coupled to each remaining electrode. Thus, a power semiconductor package according to the present invention further includes first control clip 36 electrically and mechanically coupled to first control electrode 24, second control clip 38 electrically and mechanically coupled to second control electrode 26, first current sense clip 40 electrically and mechanically coupled to first current sense electrode 28, and second current sense clip 42 electrically and mechanically coupled to second current source electrode 30.

Referring to FIGS. 3-6, according to one aspect of the present invention, semiconductor package 30 is protected by a passivation body 44, which covers at least semiconductor die 10. Preferably, clips 32, 34, 36, 38, 40, 42 may also be covered by passivation body 44 except for those portions needed for external connection to, for example, conductive pads of a circuit board. Passivation body 10 is made from a material that is capable of protecting semiconductor die 10. As a result, a package according to the present invention does not need a housing made, for example, from mold compound or any other housing material.

It should be noted that clips 32, 34, 36, 38, 40, 42 serve as external connectors, or leads for package 30. Thus, each clip 32, 34, 36, 38, 40, 42 includes a portion configured for external connection to, for example, a conductive pad on a substrate. As seen in FIGS. 2-6, the portion of each clip 32, 34, 36, 38, 40, 42 that is configured for external connection may be enlarged which may require the same to be extended beyond the outer boundary of semiconductor die 10. Thus, as seen in FIGS. 2-6, clips 32, 34, 36, 38, 40, 42 flange outwardly from the outer edges of semiconductor die 10. Thus, connection surfaces (surfaces configured for external connection) 46, which are preferably coplanar, can be widened. As a result, a small semiconductor die that is otherwise incapable of surface mounting is readied for surface mounting on, for example, conductive pads of a circuit board. It should be noted that connection surfaces 46 are preferably spaced from semiconductor die 10, which allows, if required, for post-mounting cleaning of flux residue and/or inspection of the connection of connection surfaces 46 to the conductive pads of the substrate.

In the preferred embodiment, each clip 32, 34, 36, 38, 40, 42 is electrically and mechanically connected to a respective electrode of semiconductor die 10 by an appropriate electrically conductive adhesive 48, such as, solder, conductive epoxy, or the like. Alternatively, cold welding may be used to obtain the desired electrical and mechanical connection.

Clips 32, 34, 36, 38, 40, 42 of the preferred embodiment are part of a lead frame, which may be fabricated using any suitable method or combination of methods to obtain metal clips with a fine definition. Thus, for example, to fabricate the clips the lead frame may be initially stamped, and larger portions of the lead frame may be removed by punching or the like method. Thereafter, finer definition may be carried out using laser cutting, laser ablation, etching or the like. Alternatively, the punching step may be replaced by laser cutting, laser ablation, etching or the like.

Once the lead frame is fabricated, it is preferably plated to render the same solderable. Thus, for example, a lead frame may be fabricated with copper and plated using electroless nickel immersion gold (ENiG).

To electrically and mechanically couple clips 32, 34, 36, 38, 40, 42 in the lead frame to the appropriate electrodes a conductive adhesive can be either deposited on the electrodes of semiconductor 10, or the lead frame. A conductive adhesive such as solder may be deposited in paste form on either the electrodes or the lead frame. Alternatively, the lead frame can be subjected to pre-soldering by dipping the lead frame in molten solder. A suitable solder for use in a package according to the present invention may be Gold/tin solder which includes about 80% Au (by weight) and about 20% (tin).

Regardless of which method is used to apply solder, the semiconductor die and the lead frame will be disposed on one another and a soldering reflow step is applied to connect clips 32, 34, 36, 38, 40, 42 to the appropriate electrodes. Preferably, the reflow step may be carried out using laser soldering in a suitable environment (e.g., reduced oxygen, vacuum, forming gas or the like).

Once the semiconductor die and the lead frame are soldered to one another, a cleaning step may be applied (if required), and then the assembly of the semiconductor die and the lead frame is passivated. To passivate the assembly, preferably the assembly will be immersed into a suitable passivation material, after which, the passivation may be cured (if required). A suitable passivation material may be a polymer, such as, a polysiloxane-based passivation polymer.

Thereafter, the lead frame can be singulated. That is, the individual clips can be cut out of the lead frame form to produce a package according to the present invention. Laser cutting, laser ablation, etching or the like can be suitable methods for singulation as these methods are capable of fine definition fabrication.

While the production of a package according to the invention seems relatively complicated and involves a number of steps, the process is not necessarily expensive in that many of the steps can be carried out on the same laser equipment, which enables one machine to carry out several of the steps. Moreover, the laser fabrication is relatively fast. For example, lasers dedicated to this type of processing are able to cut materials of the dimensions stated herein in excess of ten meters a minute.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A semiconductor package comprising:
a semiconductor die that includes a power device having at least a first power electrode and a second power electrode over a top surface of said semiconductor die, each power electrode including spaced power fingers originating from each respective power electrode;
a first conductive clip over said top surface of said semiconductor die and coupled to said first power electrode, said first conductive clip including a first mounting surface and a first plurality of spaced fingers;
a second conductive clip coupled to said second power electrode, said second conductive clip including a second mounting surface and a second plurality of spaced fingers being coplanar with said first plurality of spaced fingers, and said second mounting surface of said second conductive clip being coplanar with said first mounting surface of said first conductive clip such that said semiconductor die is configured for surface mounting.

2. The semiconductor package of claim 1, further comprising a passivation body encapsulating said semiconductor die.

3. The semiconductor package of claim 1, wherein said semiconductor die comprises a III-nitride semiconductor.

4. The semiconductor package of claim 3, wherein said III-nitride semiconductor is an alloy of InAlGaN.

5. The semiconductor package of claim 1, wherein said power fingers are arranged in an interdigited pattern.

6. The semiconductor package of claim 1 further comprising a control electrode, and a first conductive control clip coupled to said control electrode.

7. The semiconductor package of claim 1 further comprising a current sense electrode, and a current sense clip coupled to said current sense electrode.

8. The semiconductor package of claim 1, wherein said semiconductor die includes a first control electrode, and a first conductive control clip coupled to said first control electrode; and a second control electrode, and a second conductive control clip coupled to said second control electrode.

9. The semiconductor package of claim 8 further comprising at least one current sense electrode, and a current sense clip coupled to said current sense electrode.

10. The semiconductor package of claim 1, wherein said first and said second conductive clips are coupled to said first and said second power electrodes by a conductive adhesive.

11. The semiconductor package of claim 10, wherein said conductive adhesive comprises either a solder or a conductive polymer.

12. The semiconductor package of claim 10, wherein said conductive adhesive comprises a gold/tin solder.

13. The semiconductor package of claim 2, wherein said passivation body comprises a polymer.

14. The semiconductor package of claim 13, wherein said polymer comprises polysiloxane.

* * * * *